(12) United States Patent
Wada et al.

(10) Patent No.: US 6,514,869 B2
(45) Date of Patent: Feb. 4, 2003

(54) METHOD FOR USE IN MANUFACTURING A SEMICONDUCTOR DEVICE

(75) Inventors: Tetsuya Wada, Tokyo (JP); Toshimitsu Miyata, Tokyo (JP); Eisuke Nishitani, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 09/924,538

(22) Filed: Aug. 9, 2001

(65) Prior Publication Data

US 2002/0034862 A1 Mar. 21, 2002

(30) Foreign Application Priority Data

Sep. 19, 2000 (JP) .......................... 2000-282828

(51) Int. Cl.⁷ ...................... H01L 21/311; H01L 21/461
(52) U.S. Cl. ................... 438/715; 438/716; 438/509; 438/522; 438/530
(58) Field of Search ................... 438/715, 716, 438/509, 522, 530, 540, 660, 781, 484

(56) References Cited

U.S. PATENT DOCUMENTS 5,178,682 A * 1/1993 Tsukamoto et al. ......... 118/722

OTHER PUBLICATIONS

Fukai et al. "Manufacture of multi–layered printed wiring board" Japanese Abstract Publication No. JP410163629A, Jun. 19, 1998.*

Koyama, Kazuhide "Gas removing device method for wafer holder" Japanese Abstract Publication No. JP404116165A, Apr. 16, 1992.*

* cited by examiner

*Primary Examiner*—Carl Whitehead, Jr.
*Assistant Examiner*—Craig Thompson
(74) *Attorney, Agent, or Firm*—Bacon & Thomas

(57) ABSTRACT

In a semiconductor device manufacturing method for processing a plurality of substrates by alternately repeating a pretreatment stage and a continuous substrate processing stage, the continuous substrate processing stage comprises the steps of: loading a substrate on a heater unit located at a substrate loading/unloading position, the heater unit supporting and heating the substrate; processing the loaded substrate after transferring the heater unit having thereon the loaded substrate to a substrate processing position; unloading the processed substrate; and repeating the loading step, the processing step and the unloading step until a set of substrates are processed, and wherein the pretreatment stage is carried out by maintaining the heater unit between the substrate loading/unloading position and the substrate processing position.

5 Claims, 6 Drawing Sheets

METHOD FOR USE IN MANUFACTURING A SEMICONDUCTOR DEVICE

FIELD OF THE INVENTION

The present invention relates to a semiconductor device manufacturing method and apparatus; and, more particularly, to a method for manufacturing a semiconductor device employing, e.g., a cold-wall type single wafer chemical vapor deposition (CVD) apparatus.

DESCRIPTION OF THE PRIOR ART

FIG. 5 shows a cross sectional view of a conventional cold-wall type single wafer chemical vapor deposition (CVD) apparatus 500. As shown in FIG. 5, the apparatus 500 includes an exhaust port 2 prepared on a main body 1, a shower head 3 prepared at an upper part of the main body 1 and a gas inlet 4 installed in the main body 1, the gas inlet 4 being located above the shower head 3. The apparatus 500 further includes a heater unit 13, which is comprised of a support member 5 vertically movable in the main body 1, a base 6 mounted on the support member 5, a heater 7 installed on the base 6 through heater electrodes 8 and a susceptor 9 positioned above the heater 7 and mounted on the support member 5. A silicon wafer 10 mounted on the susceptor 9 and a cover plate 11 is mounted on the support member 5. A transfer mechanism (not shown) to move the heater unit 13 is also installed in the apparatus 500. Further, a reaction chamber 12 to process the silicon wafer 10 is provided in the apparatus 500. In FIG. 5, the reference numeral 15 represents a substrate loading/unloading port 15 through which the silicon wafer 10 is loaded and unloaded into and from the reaction chamber 12.

Hereinafter, there will be described a method for depositing a ruthenium film or ruthenium oxide film on a silicon wafer by employing the cold-wall type single wafer CVD apparatus 500 shown in FIG. 5.

First, the heater unit 13 is kept at a substrate loading/unloading position or a substrate processing position while the silicon wafer 10 is not mounted on the susceptor 9. Under this condition, nitrogen gas is supplied into the reaction chamber 12 to thereby perform a purge operation thereof and an electric power is supplied to the heater 7 to thereby stabilize the inner temperature of the apparatus 500. The process described above is referred to as a pretreatment stage of a continuous substrate processing stage.

Next, the silicon wafer 10 is loaded on the susceptor 9 through the substrate loading/unloading port 15. Then, by employing the heater unit transfer mechanism (not shown), the heater unit 13 is moved from the substrate loading/unloading position shown in FIG. 6 to the substrate processing position shown in FIG. 5. Further, the silicon wafer 10 is heated by the heater 7 to a processing temperature ranging from about 290° C. to about 350° C.

Thereafter, a nitrogen gas is fed into the reaction chamber 12 to thereby set the inner pressure of the reaction chamber 12 at an optimum processing pressure. In a subsequent step, a ruthenium containing source gas and an oxygen containing gas are supplied to a space above the shower head 3 through the gas inlet 4. The source gas and the oxygen containing gas are simultaneously showered down onto the silicon wafer 10 through the shower head 3 and ruthenium in the source gas is deposited on the silicon wafer 10 through the reaction with oxygen in the oxygen containing gas, thereby forming a ruthenium film or ruthenium oxide film on the silicon wafer 10.

Next, the supply of the source gas and the oxygen containing gas is stopped and a purge operation is performed in the reaction chamber 12 by supplying nitrogen gas to remove the remaining gases. Then, the processed silicon wafer 10 is lowered by transferring the heater unit 13 from the substrate processing position to the substrate loading/unloading position by the heater unit transfer mechanism, and unloaded from the apparatus 500 through the substrate loading/unloading port 15.

A new silicon wafer 10 is then mounted on the susceptor 9 and the deposition process of the ruthenium film or the ruthenium oxide film on the new silicon wafer 10 is performed in a same manner as described above. The above process is continuously repeated to process a set of silicon wafers, thus completing one continuous substrate processing stage.

After one continuous substrate processing stage is completed, the pretreatment stage is carried out prior to starting a subsequent continuous substrate processing stage for another set of silicon wafers. During the pretreatment stage as described above, the heater unit 13 without the silicon wafer 10 loaded on the susceptor 9 is kept at either the substrate loading/unloading position or the substrate processing position; and a purge operation is performed by supplying nitrogen gas into the reaction chamber 12 and an electric power is supplied to the heater 7 to thereby stabilize a temperature condition of the apparatus 500.

The conventional pretreatment stage described above has certain drawbacks in that it may be subjected to large temporal temperature variations at the shower head 3. Specifically, when the pretreatment stage is carried out while maintaining the heater unit 13 at the substrate loading/unloading position, the temperature of the shower head 3 at the onset of the subsequent continuous substrate processing stage becomes considerably lower than that after being stabilized during the continuous substrate processing stage.

On the other hand, in case when the heater unit 13 is kept at the substrate processing position until the subsequent continuous substrate processing stage starts, the temperature of the shower head 3 at the beginning of the continuous substrate processing stage becomes a lot higher than that after being stabilized during the continuous substrate processing stage. Accordingly, since the temperature of the shower head 3 during the continuous substrate processing stage can vary greatly as described above, it may be difficult to form a ruthenium film or a ruthenium oxide film having a uniform thickness and a uniform film quality.

SUMMARY OF THE INVENTION

It is, therefore, an object of the present invention to provide a method and apparatus capable of continuously processing a set of substrates while temporally reducing ambient temperature variations around the substrates.

In accordance with one aspect of the invention, there is provided a semiconductor device manufacturing method for processing a plurality of substrates by alternately repeating a pretreatment stage and a continuous substrate processing stage, wherein the continuous substrate processing stage comprises the steps of: loading a substrate on a heater unit located at a substrate loading/unloading position, the heater unit supporting and heating the substrate; processing the loaded substrate by transferring the heater unit having thereon the loaded substrate to a substrate processing position; unloading the processed substrate; and repeating the loading step, the processing step and the unloading step until a set of substrates are processed, and wherein the pretreatment stage is carried out by maintaining the heater unit between the substrate loading/unloading position and the substrate processing position.

In accordance with another aspect of the invention, there is provided a semiconductor device manufacturing apparatus comprising: a reaction chamber to process substrates; a heater unit to support and heat the substrates; and a shower head for feeding a process gas to the substrates in a spray form, wherein the substrates are processed according to the above-mentioned method.

In accordance with still another aspect of the invention, there is provided a semiconductor device manufacturing method for processing a plurality of substrates by alternately repeating a pretreatment stage and a continuous substrate processing stage, wherein the continuous substrate processing stage comprises the steps of: loading a substrate on a heater unit located at a substrate loading/unloading position, the heater unit supporting and heating the substrate; processing the loaded substrate after transferring the heater unit having thereon the loaded substrate to a substrate processing position and supplying a process gas onto the loaded substrate through a shower head facing the loaded substrate; unloading the processed substrate; and repeating the loading step, the processing step and the unloading step until a set of substrates are processed, and wherein the shower head is heated by the heater unit during the pretreatment stage to reduce a temperature variation during the continuous substrate processing stage.

BRIEF DESCRIPTION OF THE DRAWINGS

The above and other objects and features of the present invention will become apparent from the following description given in conjunction with the accompanying drawings, in which.

DETAILED DESCRIPTION OF THE PREFERRED EMBODIMENTS

Figure 1:
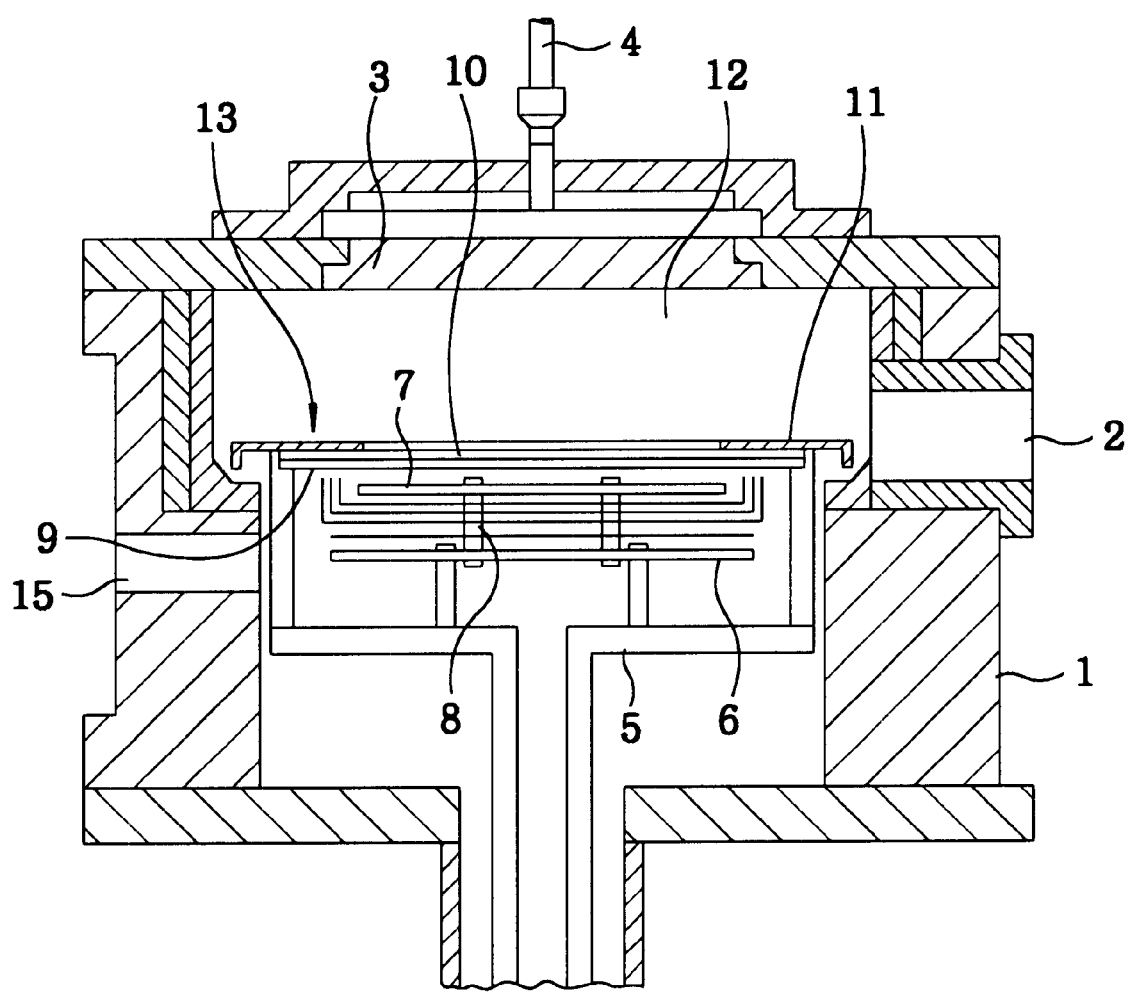
FIG. 1 illustrates a cross sectional view of a cold-wall type single wafer chemical vapor deposition (CVD) apparatus showing a heater unit position during a pretreatment stage in accordance with a preferred embodiment of the present invention.

Preferred embodiments of the present invention will now be described in detail with reference to the accompanying drawings of FIGS. 1–6. In FIGS. 1–6, like reference numerals represent like parts.

FIG. 1 illustrates a cross sectional view of a cold-wall type single wafer chemical vapor deposition (CVD) apparatus 100 showing a location of the heater unit 13 during the pretreatment stage. In accordance with a preferred embodiment of the present invention, the heater unit 13 is kept within the region between the substrate loading/unloading position and the substrate processing position until the continuous substrate processing stage starts. In this case, it is preferable that a distance from the shower head 3 to the wafer mounting surface, i.e., the top surface of a susceptor 9, in the heater unit 13 ranges from about 10 mm to about 53 mm. In the apparatus 100, the distance is preferably set as about 53 mm. It should be noted that during the pretreatment stage the heater unit 13 can be fixed at a certain position within the region between the substrate loading/unloading position and the substrate processing position or can be moved up and down therebetween.

From now on, there will be described a method for depositing a ruthenium film or a ruthenium oxide film on a silicon wafer by employing the cold-wall type single wafer CVD apparatus 500 illustrated in FIG. 1. First, the heater unit 13 without bearing the silicon wafer 10 is kept within the region between the substrate loading/unloading position and a substrate processing position as illustrated in FIG. 1. In the meantime, a nitrogen gas is fed into the reaction chamber 12 to thereby perform a purge operation thereof and then an electric power is supplied to the heater 7 while maintaining the pressure of the reaction chamber 12 at about 133 Pa(=1 Torr) to thereby stabilize a temperature condition in the apparatus 500 (the reaction chamber 12) and prepare the subsequent continuous substrate processing stage. The process described above is referred to as the pretreatment stage prior to the continuous substrate processing stage. It is preferable that a temperature of the shower head 3 during the pretreatment stage is controlled such that the variation in the temperature of the shower head 3 during the pretreatment stage is limited within a reduced range during the subsequent continuous substrate processing stage.

Figure 5:
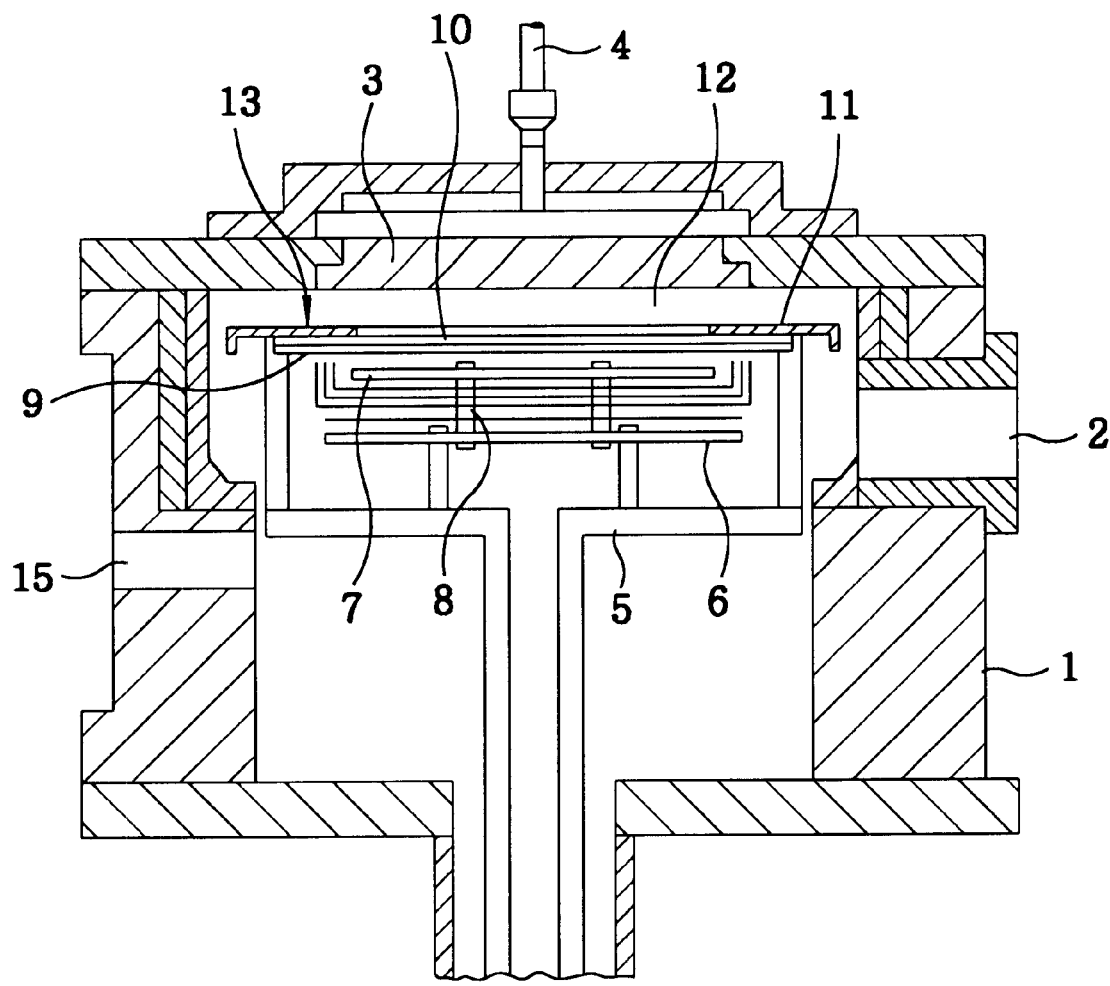
FIG. 5 shows a cross sectional view of a conventional cold-wall type single wafer CVD apparatus showing the substrate loading/unloading position.
Figure 6:
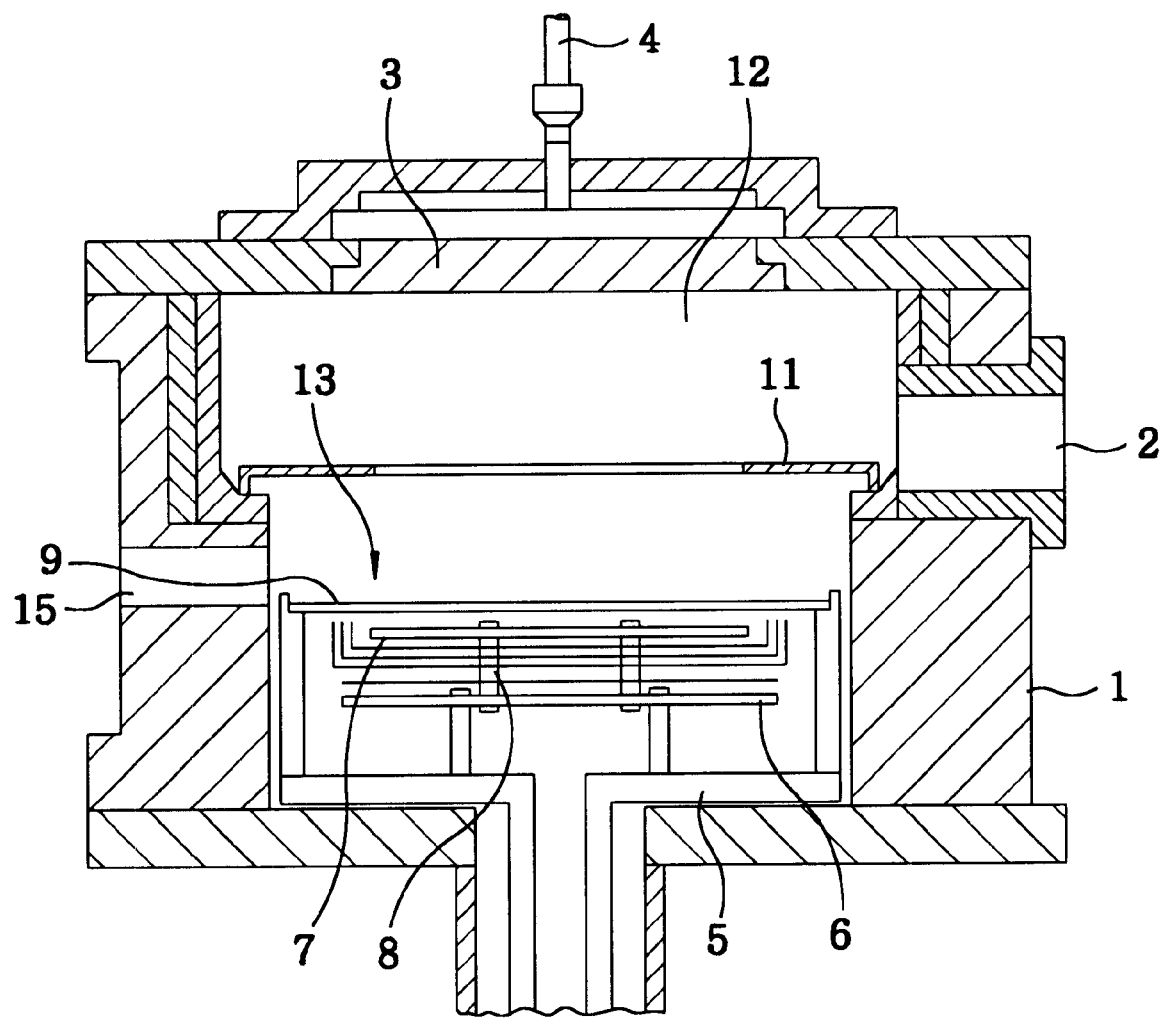
FIG. 6 sets forth a cross sectional view of the conventional cold-wall type single wafer CVD apparatus showing the substrate processing position.

Next, while the inner pressure of the reaction chamber 12 is maintained at about 133 Pa(=1 Torr) by continuously feeding nitrogen gas therein, the heater unit 13 is moved down to the substrate loading/unloading position (as represented in FIG. 6) by employing a heater unit transfer mechanism (not shown). Thereafter, the silicon wafer 10 is loaded on top of the susceptor 9 through the substrate loading/unloading port 15. Then, the heater unit 13 is moved up by using the heater transfer mechanism from the substrate loading/unloading position to the substrate processing position, so that the silicon wafer 10 mounted on the susceptor 9 is elevated to the substrate processing position in the reaction chamber 12 (as shown in FIG. 5).

Thereafter, a nitrogen gas is flown again into the reaction chamber 12 to perform the purge operation where the inner pressure of the reaction chamber 12 is increased to about 665 Pa(=5 Torr). The silicon wafer 10 is heated to a temperature ranging from about 290° C. to about 350° C. by the heater 7. In a subsequent step, ruthenium containing source gas, e.g., evaporated $Ru(C_2H_5C_5H_4)_2$ gas, is fed through a vent line (not shown). The source gas is then supplied to the space above the shower head 3, wherein the amount of the source gas supplied through the gas inlet 4 ranges from about 0.005 ccm to about 0.12 ccm.

While the source gas is being supplied, as described above, an oxygen containing gas, e.g., $O_2$ gas, whose amount ranges from about 40 sccm to about 1500 sccm, is supplied to the upper space of the shower head 3 through the gas inlet 4. In this case, the processing gas, i.e., the mixture of the source gas and the oxygen containing gas is supplied to the silicon wafer 10 in a spray form through the shower head 3, wherein ruthenium in the source gas is deposited on the silicon wafer 10 in a form of ruthenium or ruthenium oxide film by the reaction with oxygen in the oxygen containing gas.

Next, supply of the source gas and the oxygen containing gas is stopped and a purge operation is performed in the reaction chamber 12 by supplying nitrogen gas thereinto to remove remaining processing gas. Then, the heater unit 13 is transferred from the substrate processing position to the substrate loading/unloading position by the heater unit transfer mechanism. The processed silicon wafer 10 thus lowered is outputted from the apparatus 500 through the substrate loading/unloading port 15 while maintaining the inner pressure of the reaction chamber 12 at about 133 Pa (=1 Torr) by allowing the nitrogen gas to flow into the reaction chamber 12. Then, a new silicon wafer 10 is mounted on the susceptor 9 and the process of depositing a ruthenium film or a ruthenium oxide film on the new silicon wafer 10 is performed in an identical manner as described above.

This processing is repeatedly applied to each of a plurality of silicon wafers. Namely, the continuous substrate processing stage is executed. After the continuous substrate processing stage for a set of wafers is completed, the pretreatment stage described above is carried out again, specifically, during the pretreatment stage the heater unit 13 without bearing a silicon wafer 10 on the susceptor 9 is kept between the substrate loading/unloading position and the substrate processing position as illustrated in FIG. 1; a purge operation is performed by allowing the nitrogen gas to flow into the reaction chamber 12; and an electric power is supplied to the heater 7. During the pretreatment stage, the inner pressure of the reaction chamber 12 is maintained at about 133 Pa(=1 Torr) to thereby stabilize the temperature condition of (the reaction chamber 12 in) the apparatus 100. It is preferable that the temperature of the shower head 3 is substantially equal to that of the silicon wafer 10 while performing the continuous substrate processing stage. The pretreatment stage and the continuous substrate processing stage are alternately repeated until a desired number of wafers are processed.

In this method for use in manufacturing the semiconductor device in accordance with the preferred embodiment of the present invention, the temperature of a periphery portion, e.g., the shower head 3, of the silicon wafer 10 at the beginning of the continuous substrate processing stage becomes substantially equal to that of the shower head 3 at a time when the continuous substrate processing stage reaches to a stabilized state. As a result, the temperature variation of the shower head 3 while performing the continuous substrate processing stage is small and thus it is possible to deposit a ruthenium film or a ruthenium oxide film having a uniform thickness and a uniform quality on the silicon wafer 10.

In a conventional semiconductor device manufacturing method, a predetermined number of, e.g., 10 film forming processes (the so-called dummy runnings) are performed on dummy wafers at the beginning of the continuous substrate processing stage until the inner temperature and atmosphere in the reaction chamber 12 is stabilized. And then, the processing of the silicon wafer 10 is repeatedly executed to provide actual semiconductor devices. In contrast, in accordance with the present invention, since the temperature variation in the reaction chamber 12 can be substantially suppressed, the number of dummy runnings can be reduced or no dummy runnings may be necessitated.

Figure 2:
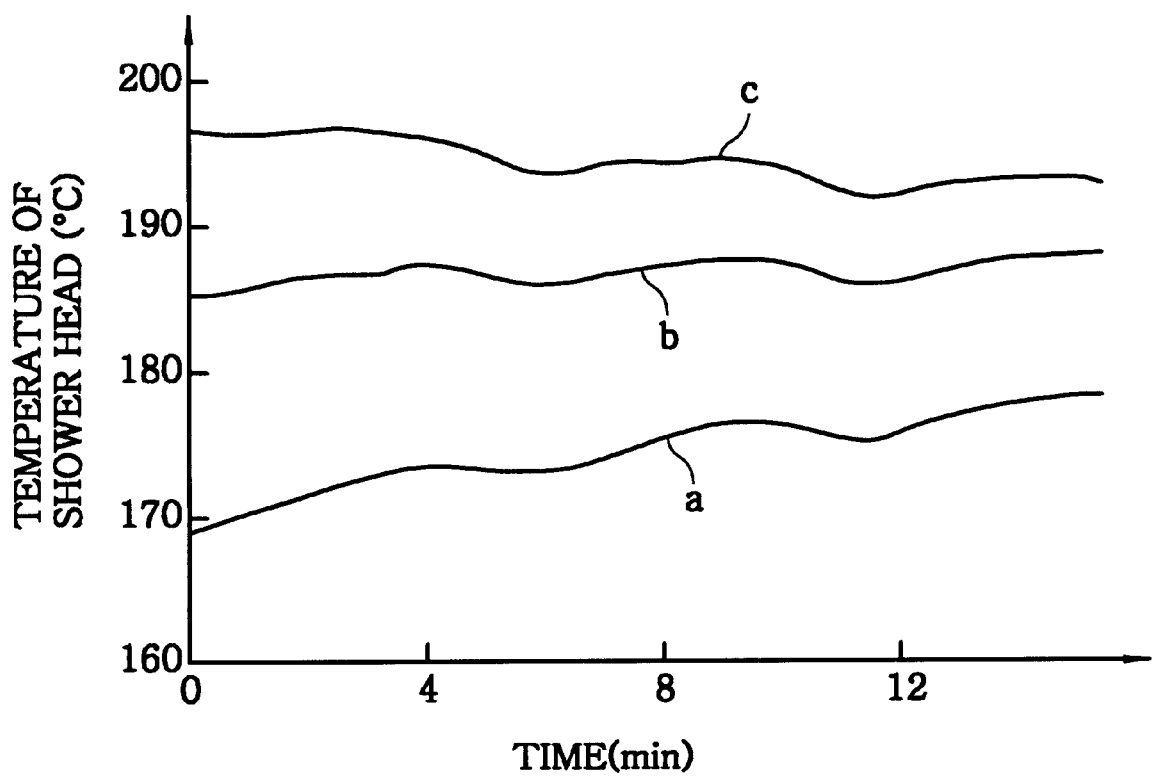
FIG. 2 depicts a graph of shower head temperature variations as a function of time while performing a continuous substrate processing stage.

FIG. 2 depicts a graph of shower head temperature variations as a function of time during the continuous substrate processing stage. In FIG. 2, a curve indicated by "a" corresponds to a case where the heater unit 13 is kept around a substrate loading/unloading position as set forth in FIG. 3 (a distance from the shower head 3 to the top of the susceptor 9 is about 95 mm) during the pretreatment stage. A curve indicated by "b" corresponds to a case where the heater unit 13 is kept in a middle position between the substrate loading/unloading position and a substrate processing position as represented in FIG. 1 (a distance from the shower head 3 to the top of the susceptor 9 is about 53 mm) during the pretreatment stage. A curve indicated by "c" corresponds to a case where the heater unit 3 is kept around the substrate processing position as presented in FIG. 4 (a distance from the shower head 3 to the top of the susceptor 9 is about 10 mm) during the pretreatment for a continuous processing thereof.

Figure 3:
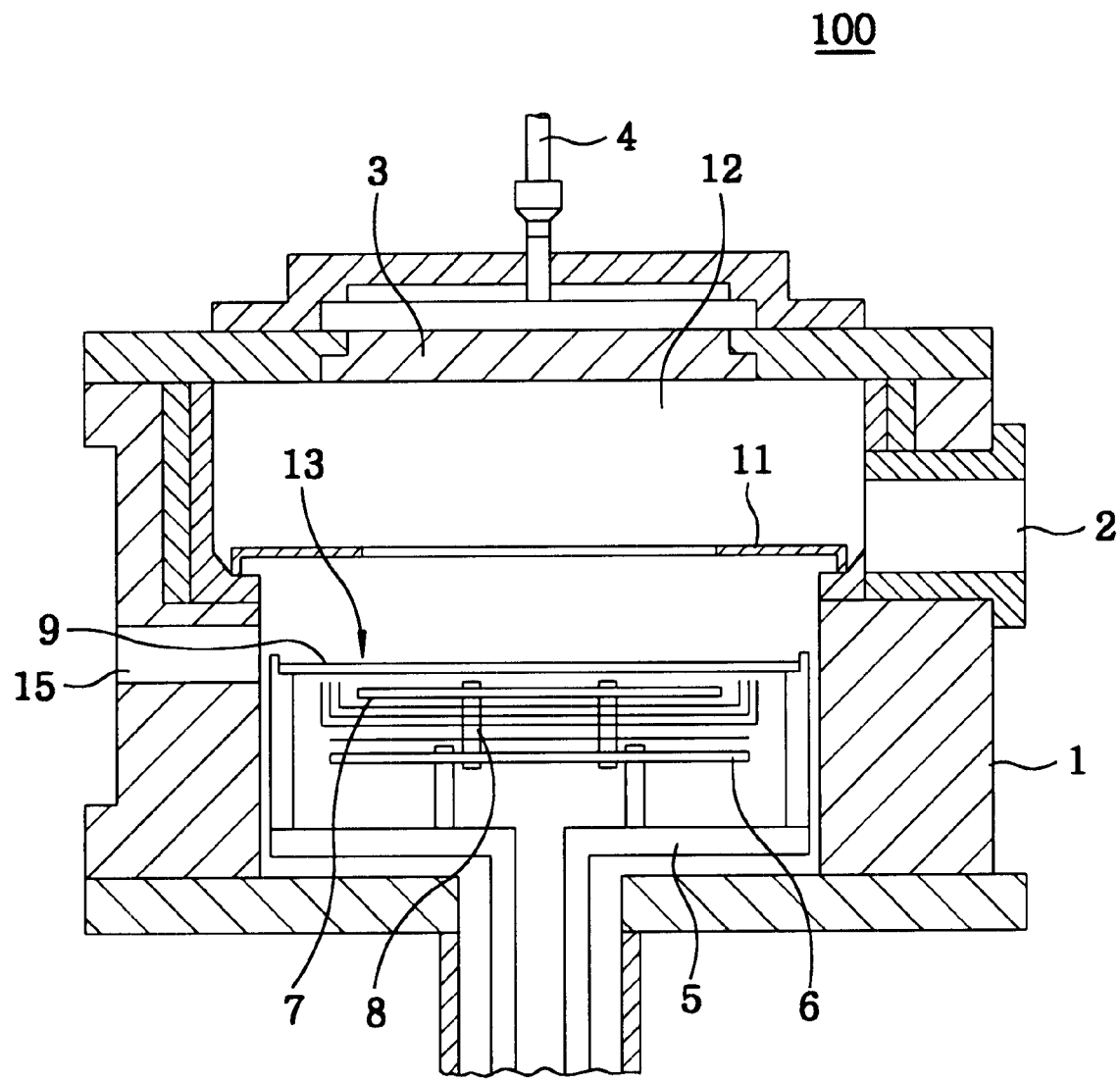
FIG. 3 presents a cross sectional view of a cold-wall type single wafer CVD apparatus wherein the heater unit is located around the substrate loading/unloading position during the pretreatment stage.
Figure 4:
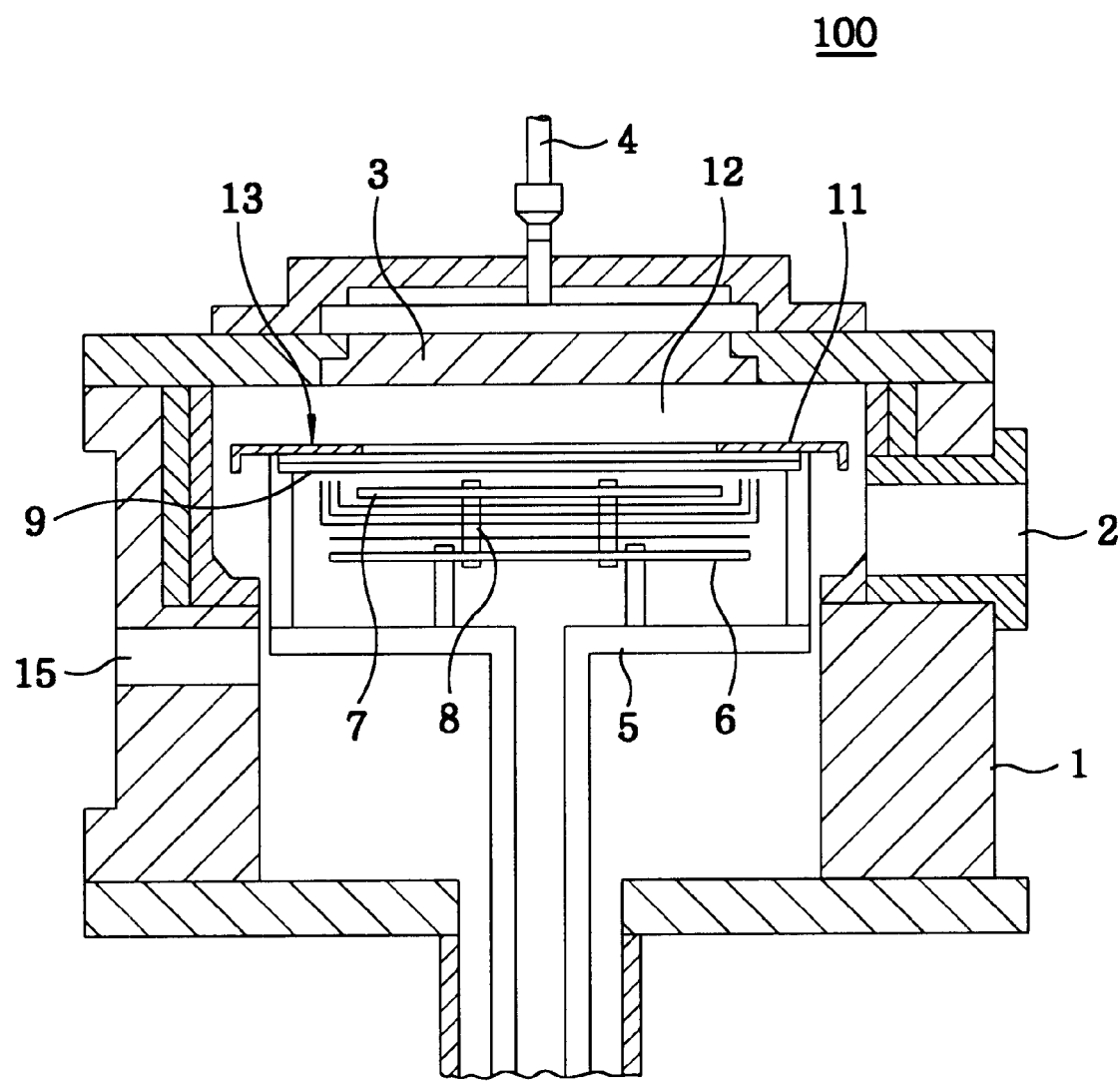
FIG. 4 represents a cross sectional view of a cold-wall type single wafer CVD apparatus wherein the heater unit is located around the substrate processing position.

As is apparent from FIG. 2, when the heater unit 13 is kept around the substrate loading/unloading position as set forth in FIG. 3, a temperature variation range of the shower head 3 during the continuous substrate processing stage is about ±4.5° C.; when the heater unit 13 is kept at the position as represented in FIG. 1, a temperature variation range of the shower head 3 during the continuous substrate processing stage is about ±2.0° C.; and when the heater unit 13 is kept at the position represented in FIG. 4, a temperature variation range of the shower head 3 during a continuous substrate processing stage is about ±2.5° C. Accordingly, if the distance from the shower head 3 to the top surface of the susceptor 9 ranges from about 10 mm to about 53 mm, the temperature variation during the continuous substrate processing stage can be limited within ±2.5° C.

While the present invention has been described with respect to the silicon wafer 10, it is to be understood that the method and apparatus of the present invention can be also applied to cases where the substrate is a glass substrate for a thin film transistor. Further, it could be apparent to those who skilled in the art that the present invention can be applied as well to cases where other semiconductor device manufacturing apparatus than the cold-wall type CVD apparatus is employed to produce different kinds of semiconductor devices. Moreover, even though the preferred embodiment of the present invention has been described with the case where the heater 7 in the heater unit 13 is installed under the susceptor 9, the method and apparatus of the present invention can also be equally applied to the cases where the heater 7 is installed within the susceptor 9 or the susceptor 9 itself functions as a heater.

While the present invention has been described with respect to certain preferred embodiments only, other modifications and variations may be made without departing from the sprit and scope of the present invention as set forth in the following claims.

What is claimed is:

1. A semiconductor device manufacturing method for processing a plurality of substrates by alternately repeating a pretreatment stage and a continuous substrate processing stage, wherein the continuous substrate processing stage comprises the steps of:

loading a substrate on a heater unit located at a substrate loading/unloading position, the heater unit supporting and heating the substrate;

processing the loaded substrate after transferring the heater unit having thereon the loaded substrate to a substrate processing position;

unloading the processed substrate; and repeating the loading step, the processing step and the unloading step until a set of substrates are processed, and wherein the pretreatment stage is carried out by maintaining the heater unit between the substrate loading/unloading position and the substrate processing position.

2. The method of claim 1, wherein the processing step includes the step of feeding a process gas to the loaded substrate through a shower head facing the loaded substrate.

3. The method of claim 2, wherein the heater unit has a substrate mounting surface for supporting the loaded substrate and the substrate mounting surface is kept at a predetermined distance from the shower head during the pretreatment stage.

4. The method of claim 3, wherein the predetermined distance ranges from about 10 mm to about 53 mm.

5. A semiconductor device manufacturing method for processing a plurality of substrates by alternately repeating a pretreatment stage and a continuous substrate processing stage, wherein the continuous substrate processing stage comprises the steps of:

loading a substrate on a heater unit located at a substrate loading/unloading position, the heater unit supporting and heating the substrate;

processing the loaded substrate by supplying a process gas onto the loaded substrate through a shower head facing the loaded substrate after transferring the heater unit having thereon the loaded substrate to a substrate processing position;

unloading the processed substrate; and repeating the loading step, the processing step and the unloading step until a set of substrates are processed, and wherein the shower head is heated by the heater unit during the pretreatment stage so that the temperature of the shower head becomes substantially equal to that while performing the continuous substrate processing stage.

* * * * *